United States Patent [19]

Ma et al.

[11] Patent Number: 4,718,117
[45] Date of Patent: Jan. 5, 1988

[54] TVRO RECEIVER SYSTEM WITH LOW-COST VIDEO-NOISE REDUCTION FILTER

[75] Inventors: John Y. Ma, Milpitas; Albert C. Houston, Santa Cruz, both of Calif.

[73] Assignee: Capetronic (BSR) Ltd., Kowloon, Hong Kong

[21] Appl. No.: 792,767

[22] Filed: Oct. 30, 1985

[51] Int. Cl.$^4$ .............................................. H04B 1/26
[52] U.S. Cl. ........................ 455/314; 455/316; 455/340; 455/307; 455/266; 333/175
[58] Field of Search ............... 455/314, 339, 340, 307, 455/260, 266, 316; 333/175, 176

[56] References Cited

U.S. PATENT DOCUMENTS

| | | | |
|---|---|---|---|
| 3,737,801 | 6/1973 | Adams et al. | 333/175 |
| 4,153,887 | 5/1979 | Poppa | 333/175 |
| 4,267,605 | 5/1981 | Matsuzawa et al. | 455/266 |
| 4,322,856 | 3/1982 | Ohta et al. | 455/189 |
| 4,512,035 | 4/1985 | Victor et al. | 455/316 |
| 4,545,072 | 10/1985 | Skutta et al. | 455/260 |

Primary Examiner—Robert L. Griffin
Assistant Examiner—Elissa Seidenglanz
Attorney, Agent, or Firm—Stephen G. Rudisill

[57] ABSTRACT

A TVRO receiver for receiving frequency-modulated video signals, the receiver comprising a tuner including a superheterodyne circuit having a voltage-controlled oscillator (VCO), means for supplying a controlling input voltage to the VCO, and a mixer for combining incoming 1st IF signals with the output of the VCO to reduce the frequency of the 1st IF signals to a 2nd IF frequency which is sufficiently high to permit the output frequency of the VCO to be above the frequency range of the 1st IF signals, and a linear phase passband filter for passing a single video channel in the 2nd IF output from the mixer, the filter producing an output which is at least about 10 dB down from its peak at both +10 MHz and −10 MHz from the center of the passband of the filter.

21 Claims, 12 Drawing Figures

TVRO RECEIVER SYSTEM WITH LOW-COST VIDEO-NOISE REDUCTION FILTER

BACKGROUND OF THE INVENTION

This invention relates generally to TVRO receivers for the reception of a wide range of satellite TV signals and, more particularly, to filtering means for reducing terrestrial interference (TI) and other video noise in a TVRO receiver system.

In a TVRO system, the satellite signals are received by an antenna (usually a paraboloidal dish) and converted to a lower "1st IF" frequency at the antenna site. This conversion may be effected by a down converter, which converts only a single channel to the 1st IF frequency, or a block converter, which converts all channels of a common polarity to a 1st IF block of frequencies ranging from 950 to 1450 MHz. This entire block of frequencies is then fed via coaxial cable to the receiver, which selects a particular channel for viewing and/or listening. In the receiver, the 1st IF signals are converted to a 2nd IF frequency range which traditionally has been centered at 70 MHz in most TVRO systems.

In the reception of TV signals broadcast by satellites, a major problem faced by conventional TVRO receivers is distortion due to terrestrial interference (TI) caused by the presence of local terrestrial microwave communication links. TI can lead to substantial degradation and even total loss of the signals received from a satellite. Previous approaches to this problem have involved the use of various filters within the TVRO receivers to perform wavetrapping within the interference region. The use of such filters is described, for example, in Battle et al., "How to Identify and Eliminate Terrestrial Interference", *TVRO Technology*, May, 1985, pp. 32–41.

The provision of TI filters is not a major challenge in TVRO receivers operating at 70 MHz or similarly low 2nd IF frequencies. However, the presently emerging generation of TVRO receivers use a higher 2nd IF, e.g., 612 MHz, so that the VCO frequencies are above the 1st IF block of frequencies to prevent the VCO from interfering with the desired signals. At these higher 2nd IF frequencies, it is extremely difficult to produce trap or notch filters with the high Q required to eliminate TI and other video noise without excessive losses in the desired video signal.

SUMMARY OF THE INVENTION

It is a primary object of the present invention to provide an improved TVRO receiver which reduces the effects of terrestrial interference and other video noise in a TVRO system using a 2nd IF frequency high enough to permit the 2nd IF VCO frequency to be above the 1st IF frequency range.

A related object is to provide a TVRO receiver system with an improved video-noise-reduction (VNR) filter, which can be manufactured at a low cost.

Another object of this invention is to provide a TVRO receiver system which rejects a significant amount of TI without requiring narrow notch or trapping filters at the TI center frequencies.

Other objects and advantages of the invention will be apparent from the following detailed description and the accompaying drawings.

In accordance with the present invention, a TVRO receiver is provided with a tuner including a superheterodyne circuit having a voltage-controlled oscillator (VCO), means for supplying a controlling input voltage to the VCO, and a mixer for combining incoming 1st IF signals with the output of the VCO to reduce the frequency of the 1st IF signals to a 2nd IF frequency which is sufficiently high to permit the output frequency of the VCO to be above the frequency range of the 1st IF signals; and a linear phase pass band filter for passing a single video channel in the 2nd IF output from the mixer, the filter producing an output which is at least about 10 db down from its peak at both +10 MHz and −10 MHz from the center of the pass band of the filter.

In another aspect of the invention, the center of the signal spectrum of the 2nd IF video signal produced by the superheterodyne circuit in the tuner is offset from the 2nd IF center frequency, and the 2nd IF signals are passed through a pass band filter which has the center of its pass band aligned with the center of the signal spectrum of the 2nd IF video signal.

BRIEF DESCRIPTION OF THE DRAWINGS

The invention and further objects and advantages thereof may best be understood by reference to the following description taken in conjunction with the accompanying drawings, in which.

DESCRIPTION OF THE PREFERRED EMBODIMENTS

Although the invention will be described in connection with certain preferred embodiments, it will be understood that it is not intended to limit the invention to those particular embodiments. On the contrary, it is intended to cover all alternatives, modifications and equivalent arrangements as may be included within the spirit and scope of the invention as defined by the appended claims.

Figure 1:
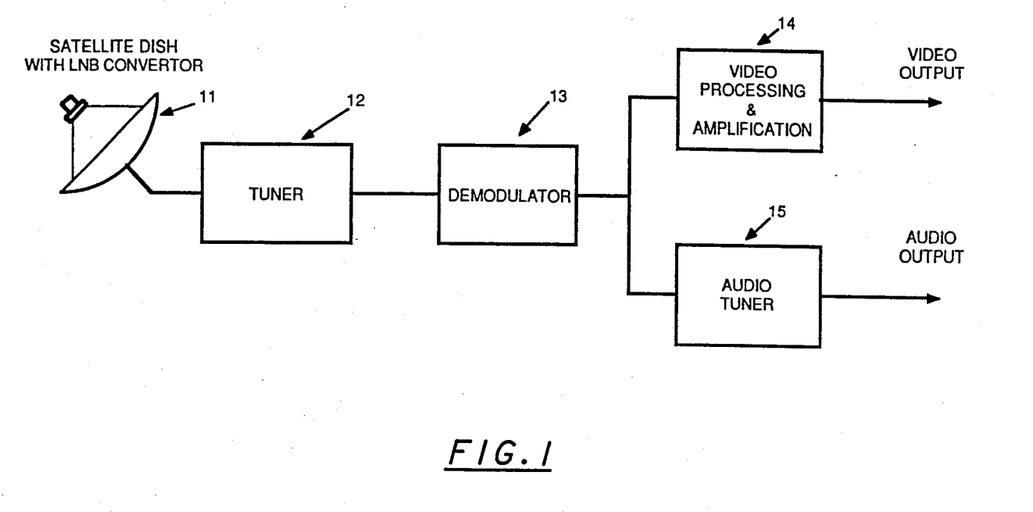
FIG. 1 is a simplified block diagram of a conventional TVRO earth station.

Referring now to the drawings, in FIG. 1 there is shown a functional block diagram of a TVRO earth station for the reception of satellite signals. The system includes an antenna 11, which is typically a paraboloidal dish equipped with a low noise block (LNB) converter and related accessories and positioning mechanisms, for capturing signals transmitted from orbiting satellites; and a receiver system including a tuner 12, a demodulator 13, a video processing and amplification section 14, and an audio tuner 15.

The antenna 11 receives signals transmitted from the satellite in the four-GHz frequency band (3.7 to 4.2 GHz); and this entire block of frequencies is converted to a 1st IF frequency range of 950 to 1450 MHz by the block converter located at the antenna site. The 1st IF signals are then sent via coaxial cable to the tuner 12 which selects a particular channel for viewing and converts the signals in that particular channel to a 2nd IF frequency range. The 2nd IF frequency range is preferably high enough to permit the 2nd IF VCO frequencies to be above the 1st IF block of frequencies, to prevent the VCO from interfering with the desired signals. For a 1st IF frequency range of 950 to 1450 MHz, this means that the center frequency of the second IF frequency range must be at least 500 MHz. A particularly preferred 2nd IF center frequency in the system of the present invention is 612 MHz.

In the demodulator 13, the 2nd IF signal is passed through an amplifier and a filter and on to a conventional video detector which demodulates the frequency-modulated signal to the baseband of the original video signal (e.g., 0 to 10 MHz), producing a composite video signal output. The filter preferably has a pass band that is only about 22 MHz wide; a pass band of this width passes the essential video and audio information while rejecting unwanted noise received by the antenna on the edges of the selected channel.

The output of the demodulator comprises the baseband signals which range from DC to about 8.5 MHz; this includes video information from about 15 KHz to 4.2 MHz, and subcarriers from about 4.5 to 8.5 MHz.

Figure 2:
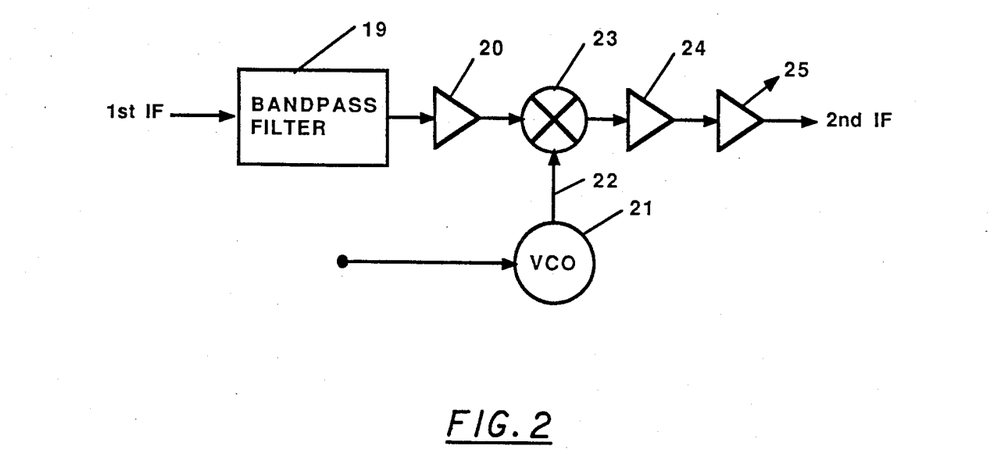
FIG. 2 is a block diagram of a tuner for use in the TVRO system of FIG. 1.

FIG. 2 shows a simplified block diagram of a suitable tuner 12 for use in the TVRO system of FIG. 1. This tuner 12 includes a passband filter 19 having a passband that is 500 MHz wide (to pass signals in the 1st IF range of 950 to 1450 MHz). From the filter 19, the 1st IF signals are passed through a preamplifier 20 to a superheterodyne circuit including a voltage-controlled oscillator (VCO) 21 receiving a controlling input voltage on line 22, and a mixer 23 for combining the output of the VCO 21 with the 1st IF output of the amplifier 20. This converts the 1st IF signals to a desired 2nd IF frequency range. The resulting 2nd IF signals are passed through a pair of amplifiers 24 and 25 and then on to the demodulator 13.

By adjusting the controlling input voltage supplied to the VCO 21 via line 22, different channels (frequency bands) in the 1st IF signals are centered on the center frequency of the 2nd IF output of the mixer 23. Each channel typically contains at least a video carrier signal, a color subcarrier signal, and an audio signal at different prescribed frequencies. These carrier and subcarrier signals for all the channels are transmitted simultaneously from the satellite to the earth station antenna 10 and block converter 11, and then over a cable to the tuner 12.

The following "Table I" is a list of the center frequencies for 24 transponders on a single satellite. Table I also lists the corresponding center frequencies in the output from the block converter 11 (identified in Table I as the 1st IF center frequencies) and the output frequencies required from the VCO 21 in order to tune the receiver to each individual transponder. It will be noted that the difference between the 1st IF center frequency and the corresponding VCO output frequency for each transponder is 612 MHz, which means that the center frequency of the 2nd If output from the mixer 23 is 612 MHz for every transponder. That is, the VCO output frequencies listed in Table I will cause the 612-MHz output frequency of the mixer 23 to be centered on the corresponding 1st IF center frequency. For example, a VCO output frequency of 2042 MHz will cause the 612-MHz output frequency of the mixer to be centered on tne 1430-MHz 1st IF center frequency of transponder No. 1. A preferred system for controlling the input voltage to the VCO 21 to produce the desired output frequencies listed above is described in Ma et al. copending U.S. patent application Ser. No. 792,784, filed Oct. 30, 1985, for "TVRO Earth Station Receiver for Reducing and Improving Picture Quality."

TABLE I

| Transponder Number ("Channel") | Transponder Center Freq. | 1st IF Center Freq. | VCO Output Freq. | 2nd IF Center Freq. |
|---|---|---|---|---|
| 1 | 3720 MHz | 1430 MHz | 2042 MHz | 612 MHz |
| 2 | 3740 | 1410 | 2022 | 612 |
| 3 | 3760 | 1390 | 2002 | 612 |
| 4 | 3780 | 1370 | 1982 | 612 |
| 5 | 3800 | 1350 | 1962 | 612 |
| 6 | 3820 | 1330 | 1942 | 612 |
| 7 | 3840 | 1310 | 1922 | 612 |
| 8 | 3860 | 1290 | 1902 | 612 |
| 9 | 3880 | 1270 | 1882 | 612 |
| 10 | 3900 | 1250 | 1862 | 612 |
| 11 | 3920 | 1230 | 1842 | 612 |
| 12 | 3940 | 1210 | 1822 | 612 |
| 13 | 3960 | 1190 | 1802 | 612 |
| 14 | 3980 | 1170 | 1782 | 612 |
| 15 | 4000 | 1150 | 1762 | 612 |
| 16 | 4020 | 1130 | 1742 | 612 |
| 17 | 4040 | 1110 | 1722 | 612 |
| 18 | 4060 | 1090 | 1702 | 612 |
| 19 | 4080 | 1070 | 1682 | 612 |
| 20 | 4100 | 1050 | 1662 | 612 |
| 21 | 4120 | 1030 | 1642 | 612 |
| 22 | 4140 | 1010 | 1622 | 612 |
| 23 | 4160 | 990 | 1602 | 612 |
| 24 | 4180 | 970 | 1582 | 612 |

Figure 3:
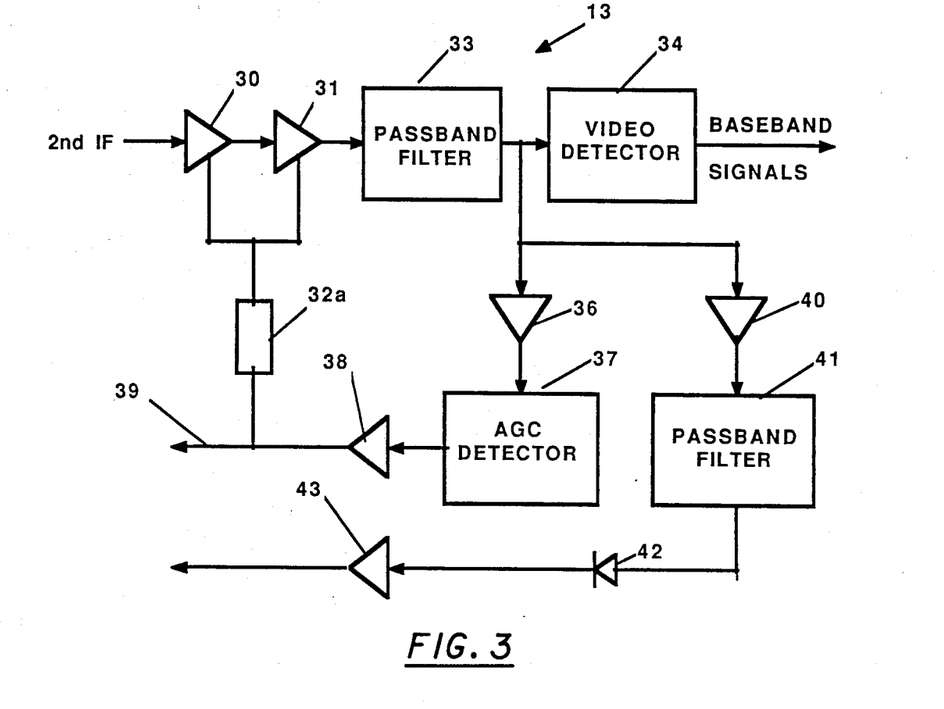
FIG. 3 is a block diagram of a demodulator for use in the TVRO system of FIG. 1.

FIG. 3 is a block diagram of a demodulator 13 for receiving the 2nd IF output of the tuner 12 in the TVRO system of FIG. 1. This demodulator circuit includes a pair of conventional IF amplifiers 30 and 31 for receiving the 2nd IF signal from the final amplifier 25 in the tuner 12. Both of these amplifiers 30 and 31 receive an automatic gain control (AGC) signal from an input terminal 32. From the amplifier 31, the 2nd IF signal is passed through a filter 33 and on to a conventional video detector 34 which demodulates the frequency-modulated signal to the baseband of the original video signal (e.g., 0 to 10 MHz), producing a composite video output signal. The 2nd IF filter 33 preferably has a pass band that is only about 22 MHz wide; a pass band of this width passes the essential video and audio information while rejecting unwanted noise received by the antenna on the edges of the selected channel.

The AGC feedback loop includes an IF amplifier 36 which amplifies the output of the filter 33 and supplies it to an AGC detector 37. The output of this detector 37 is passed through an AGC amplifier 38, which produces a signal strength meter drive signal at a terminal 39. This signal strength meter is usually located on the front panel of the TVRO receiver.

The illustrative demodulator also includes an IF amplifier 40 which receives the same input supplied to the video detector 34, amplifies it, and passes it through a narrow passband filter 41. The output of the filter 41 is passed through a detector in the form of a diode 42. The signal passed by the diode 42 is smoothed by an amplifier 43 to produce a DC output voltage that can be used to detect the presence of a signal near the center frequency of the particular satellite channel to which the receiver is tuned. Although this signal is not used in the system of the present invention, it is useful to discriminate between satellite signals and TI.

The output of the demodulator illustrated in FIG. 3 comprises the baseband signals which range from DC to about 8.5 MHz; this includes video information from about 15 KHz to 4.2 MHz, and subcarriers from about 4.5 to 8.5 MHz. The video information in these baseband signals is passed through the video processing and amplification section 14 before being displayed on a video monitor or television set, and the audio signals are passed through the audio tuner 15 and then on to one or more speakers which convert the signals to audible sound.

In terrestrial video broadcasts, the video information is normally in the form of amplitude-modulated ("AM") signals. In satellite video transmissions, on the other hand, the video information is in the form of frequency-modulated ("FM") signals for line-of-sight transmission over long distances. In FM video transmissions, the center (i.e., the peak) of the signal spectrum is offset from the nominal center frequency of the signal because of the synchronizing and blanking pulses that accompany each segment of video information.

In accordance with one aspect of the present invention, the center of the pass band of the 2nd IF filter 33 is offset from the 2nd IF center frequency (e.g., 612 MHz) so that the center of the pass band is aligned with the center of the 2nd IF signal spectrum. By centering the filter pass band on the video signal spectrum rather than the nominal center frequency of the frequency-modulated video signal, terrestrial interference and other noise on one side of the signal spectrum is rejected by the filter. This significantly improves the quality of the filtered video signal in those locations where TI or other noise is located on the edge of the video signal spectrum that is closer to the nominal center frequency of the channel.

Figure 4:
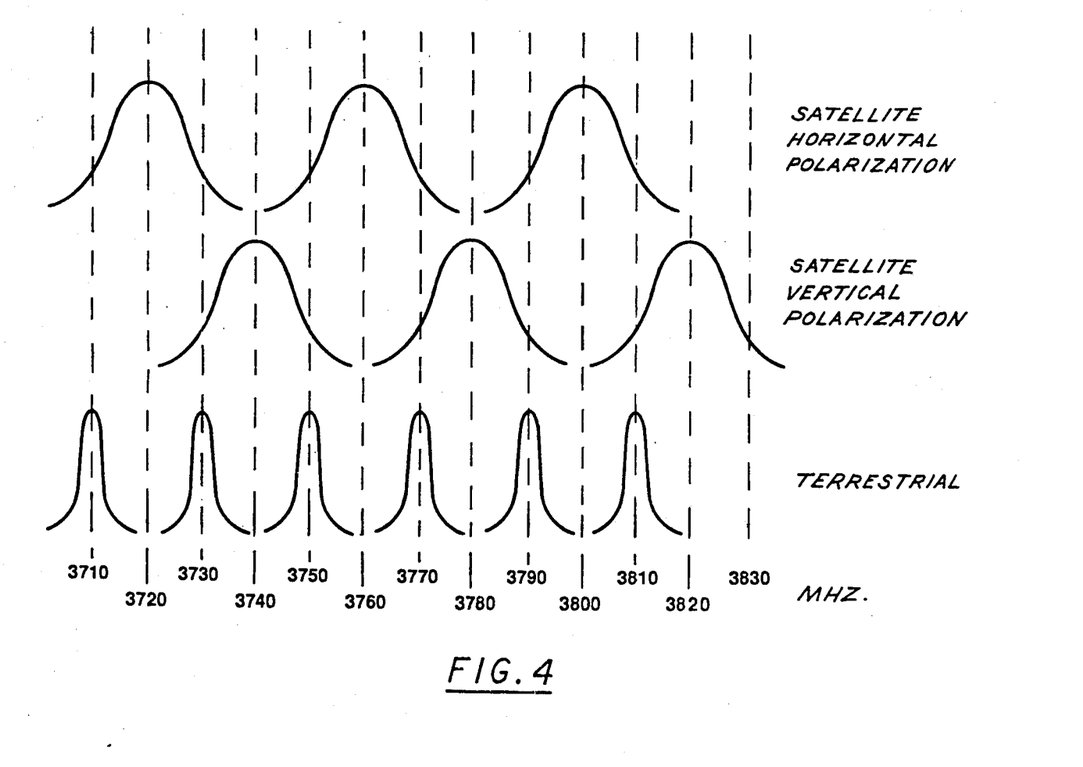
FIG. 4 is a diagrammatic illustration of exemplary signal spectra from multiple satellite transponders having adjacent center frequencies, and from multiple terrestrial microwave communication channels having center frequencies located between those of the satellite channels.

As illustrated in FIG. 4, the carrier frequencies allocated for satellite and terrestrial communications are staggered in an effort to minimize interference. Thus, terrestrial carriers are odd multiples of 10 MHz, while satellite carriers are even multiples of 10 MHz. On any given satellite, the signals from alternate transponders have a first polarization, and the signals from the intervening transponders have a second polarization orthogonal to the first. As will be appreciated from FIG. 4, TI will always be located 10 MHz away from the center frequency of any given transponder. Because the center of the video signal spectrum in a satellite signal is usually offset from the center frequency by 1 to 3 MHz, TI will normally be either 7–9 MHz or 11–13 MHz away from the center of the signal spectrum.

Figure 5:
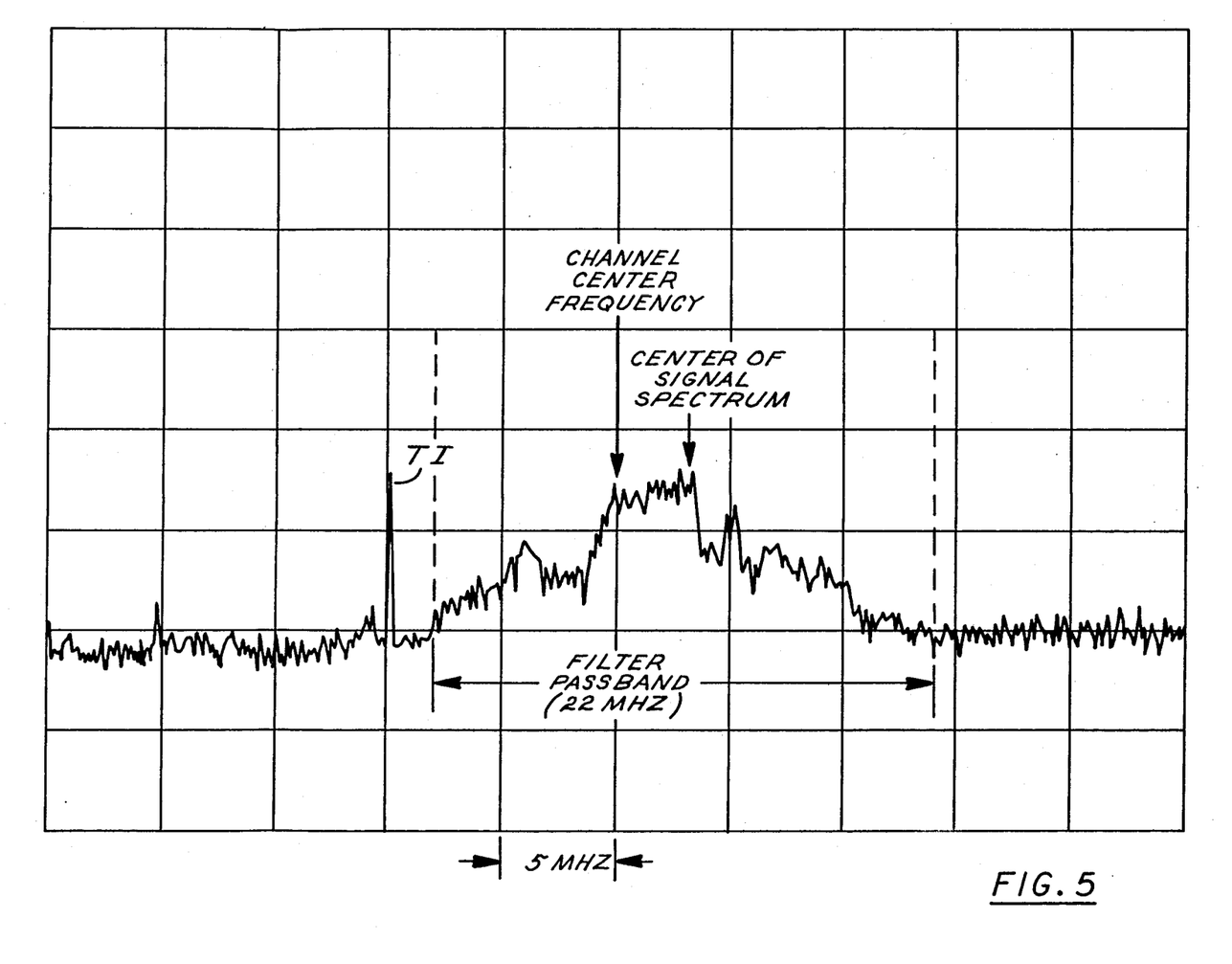
FIG. 5 is an example of a satellite video signal spectrum with TI at one edge thereof.

FIG. 5 is an actual example of a satellite video signal spectrum in which the center of the signal spectrum is offset from the transponder center frequency by about 3 MHz, and TI is present at the left edge of the spectrum, 10 MHz from the channel center frequency. It can be seen that the strength of the TI signal is is about the same as that of the satellite signal. The pass band of the filter 33 is indicated by the pair of broken lines in FIG. 5. It can be seen that this pass band, which is centered on the center of the signal spectrum and is 22 MHz wide, passes virtually all the video information in the satellite signal while rejecting the TI. The TI is rejected because it is a narrow band signal located about 13 MHz from the center of the signal spectrum, while the edge of the filter pass band is only 11 MHz from the center of the signal spectrum. It can also be seen from FIG. 5 that if the filter pass band were centered on the channel center frequency rather than the signal spectrum, the TI would be passed through the filter along with the video information.

Figure 6:
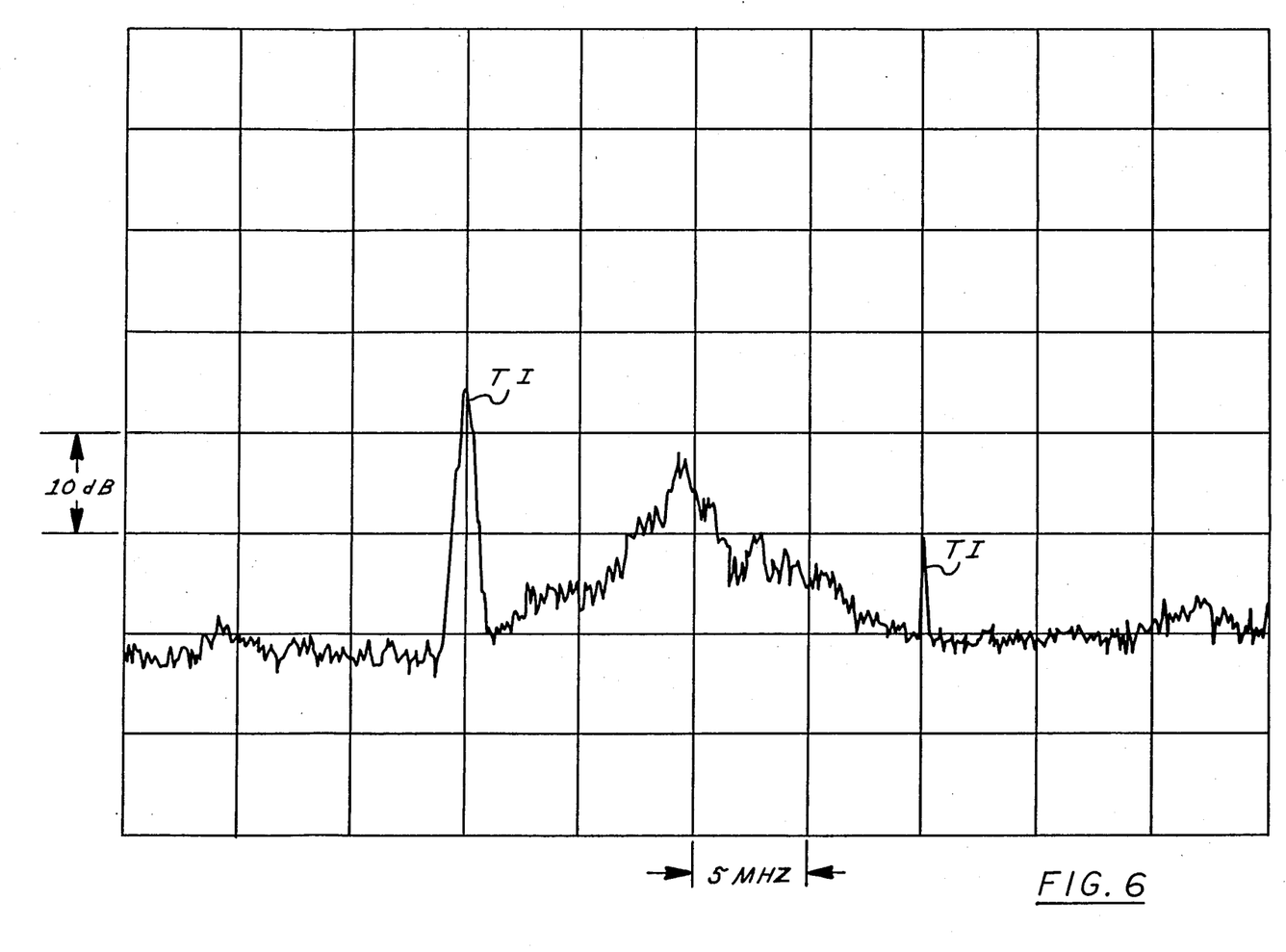
FIG. 6 is an example of the response characteristics one one exemplary filter used in accordance with the invention.

In accordance with another aspect of this invention, the 2nd IF filter is a linear phase pass band filter having a pass band profile which is at least about 10 dB down at both +10 MHz and −10 MHz from the center of the pass band. This type of filter is commonly referred to as a "haystack" filter because the rounded shape of the filter response characteristic (i.e., the pass band profile) resembles the profile of a haystack. An actual example of the response characteristic of one such filter is shown in FIG. 6. Because of its sharply sloping band edges, the haystack filter rejects a major portion of the TI and other noise at both edges of the video signal spectrum. This TI rejection is in sharp contrast to the performance of the SAW filters which are commonly used in video demodulators; the SAW filters have generally square or rectangular response characteristics which pass substantial levels of TI even at the very edges of the pass band.

Figure 7:
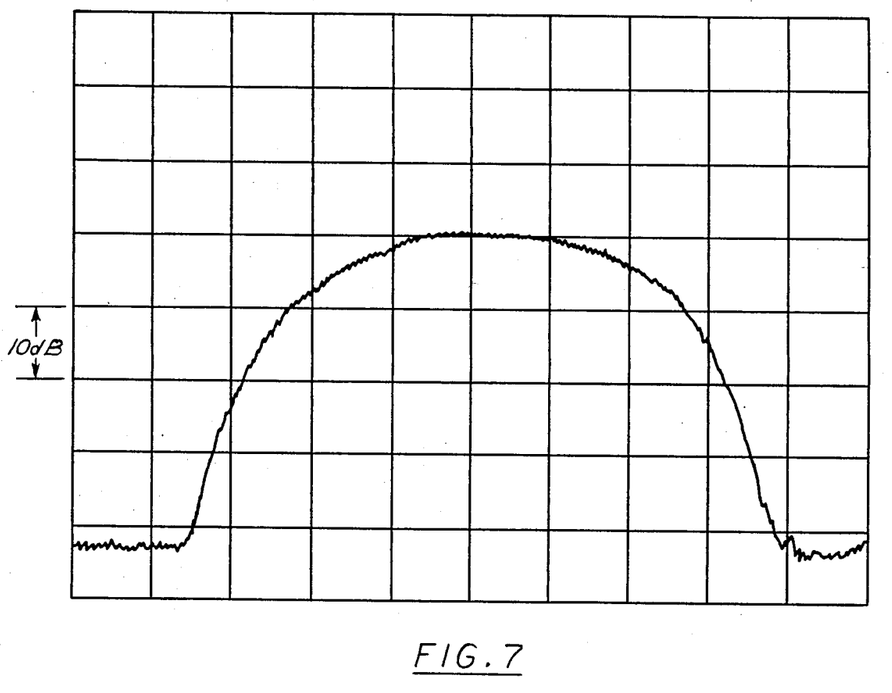
FIG. 7 is another example of a satellite video signal spectrum, with TI at both edges.

FIG. 7 is another actual example of a satellite video signal spectrum in which the center of the signal spectrum is offset from the transponder center frequency by only about 1 MHz, and TI is present at both edges of the spectrum. It can be seen that the strength of each TI signal is substantial, and in fact the TI closer to the center frequency is considerably stronger than the satellite signal. The response characteristic of the haystack filter is such that it passes virtually all the video information in the satellite signal while rejecting major portions of both the TI signals. It can be seen from FIG. 7 that a SAW filter response characteristic would pass all the TI on the upper edge of the video signal spectrum and a major portion of the TI signal on the lower edge of the spectrum.

Figure 8:
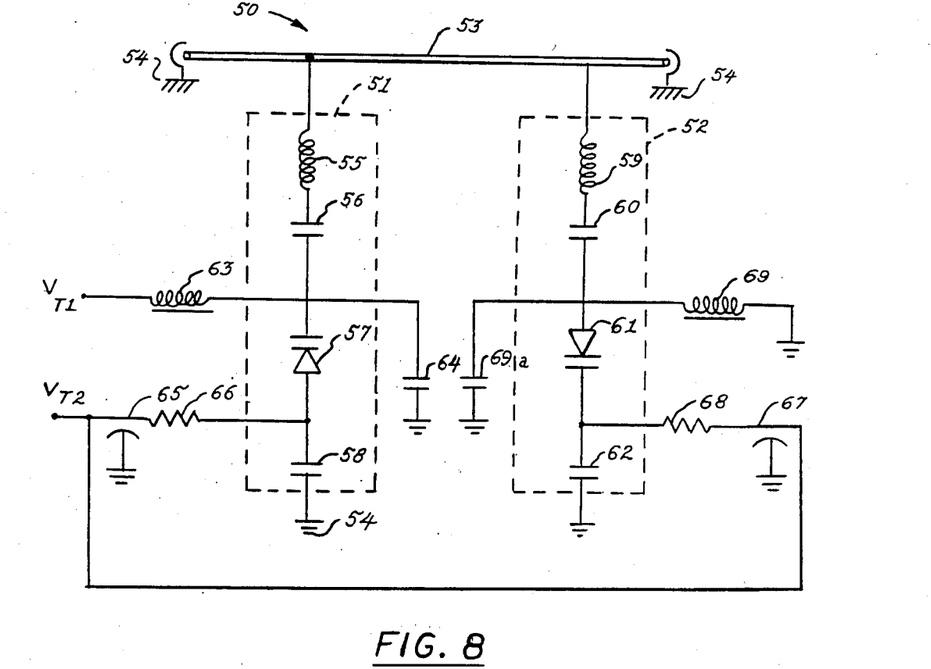
FIG. 8 is a schematic diagram of a preferred embodiment of an electronically tunable VNR filter for use, in accordance with the present invention, in the TVRO system of FIG. 1.

FIG. 8 is a schematic diagram of an exemplary video-noise-reduction filter 50 for use in accordance with the system of this invention. This filter 50 essentially comprises a first notch section 51 and a second notch section 52 connected in parallel across a length of strip transmission line 53 and a reference ground plane 54. The strip transmission line 53 is one of the conventional 50-ohm type and has both its ends connected to the reference ground plane.

The resonance of the resonant circuits within the two notch sections 51 and 52 is electronically controlled by the use of voltage-controlled variablereactance devices.

More specifically, variable reactance or varactor diodes are used within each of the notch sections to control the respective notch frequencies by electrical means. Thus, the first notch section 51 consists of a series resonant circuit comprising an inductance 55, a capacitance 56, and a varactor diode 57. A d-c blocking capacitance 58 is used within the notch section 51 to connect the cathode end of the varactor diode 57 within the resonant circuit to the reference ground plane at radio frequencies. The second notch section 52 is similar to the first one and consists of a series resonant circuit comprising an inductance 59, a capacitance 60 and a varactor diode 61.

A first tuning voltage $V_{T1}$ is applied through a radio-frequency choke 63 to the anode of the varactor diode 57. A tuning capacitor 64 also connects the junction of the radio-frequency choke 63 and the anode of the varactor diode 57 to the reference ground plane.

A second tuning voltage $V_{T2}$ is applied to the cathode of the varactor diode 57 within the notch section 51 through a series connection of a blocking capacitance 65 and a limiting resistance 66. The same tuning voltage $V_{T2}$ is also applied to the anode of the varactor diode 61 within the notch section 52 through a series connection of a blocking capacitor 67 and a limiting resistance 68. The cathode of the varactor diode 61 is also connected to the reference ground plane through a parallel connection of a radio-frequency choke 69 and a tuning capacitance 69a.

The function and operation of varactor diodes is well known. A varactor diode makes use of the change in capacitance of a reverse-biased pn junction as a function of applied voltage. The diode conducts normally in the forward direction, but the reverse current saturates at a relatively low voltage and then remains constant, eventually rising rapidly at the avalanche point. In controlling the variation in resonant frequency of the notch sections 41 and 42 of the filter 40, the operating region of interest for the varactor diodes lies between the reverse saturation point, which gives the maximum junction capacitance, and a point just above avalanche, at which the minimum diode capacitance is obtained. Thus, the limits on the range of capacitance obtained from the diode are prescribed by the two conditions limiting the reverse voltage swing, i.e., conduction and avalanche. Ideally, the varactor diodes to be used with the VNR filter, according to the preferred embodiment, should have a large capacitance variation and a small value of minimum junction capacitance, in addition to the lowest possible value of base resistance which leads to low noise.

Returning to the filter shown in FIG. 8, the two tuning voltages $V_{T1}$ and $V_{T2}$ are applied to the anode and cathode, respectively, of the varactor diode 57 within the first notch section 51, and serve to define the operating point of the varactor diode on its characteristic curve, by controlling the reverse-bias across the diode junction. More specifically, the first tuning voltage $V_{T1}$ has a fixed value and reverse-biases the varactor diode 57 by a fixed amount. The diode 57 at this point presents a certain value of junction capacitance into the resonant circuit of the first notch section 51. The value of the tuning voltage $V_{T1}$ is chosen in such a way that the resonant circuit resonates around a center frequency which corresponds to the intermediate frequency (IF) used by the filter.

Subsequently, the second tuning voltage $V_{T2}$ is applied to the varactor diode 57 and this voltage serves to change the amount of reverse-bias effective across the diode junction, which in turn produces a change in the junction capacitance presented to the resonant circuit by the varactor diode 57. The second tuning voltage $V_{T2}$ can thus be varied to adjust the notch frequency of the first notch section 51.

The second tuning voltage $V_{T2}$ is also applied to the varactor diode 61 in the second notch section 52 of the filter 50 in such a way as to reverse-bias the diode junction. Any variation in the voltage $V_{T2}$ produces a corresponding change in the junction capacitance of the varactor diode 61 and hence the resonant frequency of the resonant circuit of the second notch section 52. Thus the voltage $V_{T2}$ can be varied to adjust the notch frequency of the second notch section 52.

In effect, the second tuning voltage $V_{T2}$ can be used to adjust the width and profile of the pass band of the filter with respect to its center frequency. Even more importantly, the notch frequencies of the two notch sections 51 and 52 can be adjusted in such a way that the filter response characteristic is at least 10 dB down from its peak at both $+10$ MHz and $-10$ MHz from the center of the desired signal spectrum in the pass band.

Figure 9:
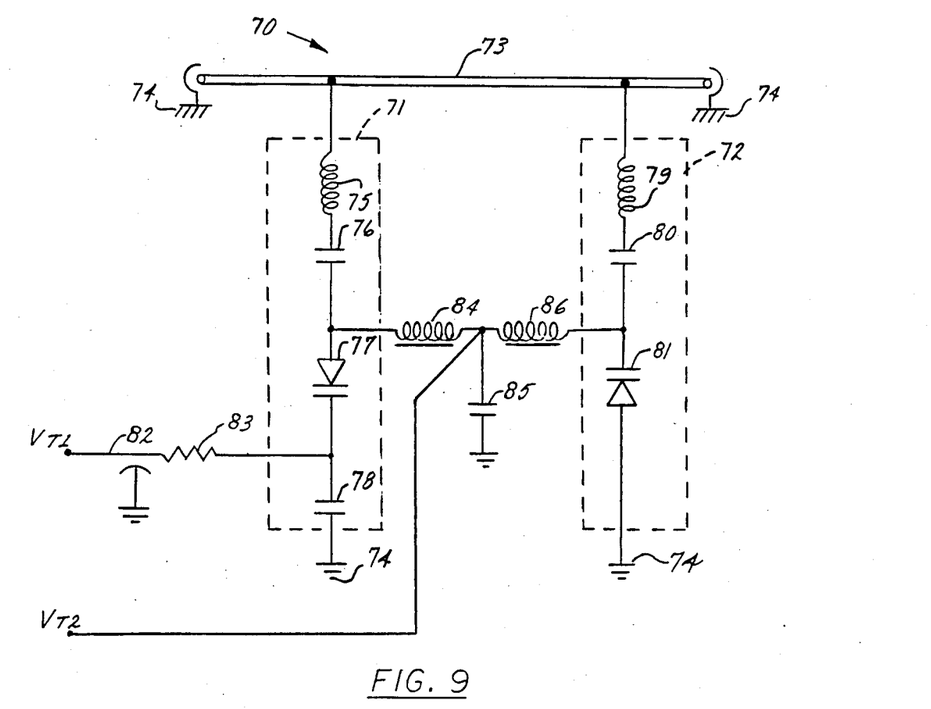
FIG. 9 is a schematic diagram of a modified embodiment of the tunable VNR filter of FIG. 8.

FIG. 9 is a schematic diagram of a possible variation of the tunable VNR filter shown in FIG. 8. The embodiment of FIG. 9 differs only in the number and symmetrical arrangement of components from the embodiment of FIG. 8.

The filter 70 of FIG. 9 essentially comprises a first notch section 71 and a second notch section 72 connected in parallel fashion across a length of strip transmission line 73 and a reference ground plane 74. As in FIG. 8, the strip transmission line 73 is of the conventional 50-ohm type and has both its ends connected to the reference ground plane. The first notch section 71 consists of a series resonant circuit comprising an inductance 75, a capacitance 76 and a varactor diode 77. The anode end of the varactor diode 77 is connected to the reference ground plane through a series capacitance 78 (RF bypass).

The second notch section 72 consists of a series resonant circuit comprising an inductance 79, a capacitance 80 and a varactor diode 81. The cathode end of the varactor diode is connected directly to the reference ground plane.

A first tuning voltage $V_{T1}$ is applied to the anode end of the varactor diode 77 within the first notch section 71 through a series connection of an RF-bypass capacitance 82 and a limiting resistance 83. The function and operation of the varactor diodes 77 and 81 are similar to those described for the diodes 57 and 61 in FIG. 8. The first tuning voltage $V_{T1}$ has a fixed value and reverse-biases the varactor diode 77 by a fixed amount. As a result, the diode 77 presents a certain value of junction capacitance into the resonant circuit of the first notch section 71. The value of the voltage $V_{T1}$ is chosen in such a way that the resonant circuit resonates at a center frequency corresponding to the intermediate frequency (IF) of the receiver in which the filter is used.

In FIG. 9, a second tuning voltage $V_{T2}$ is applied to (i) the cathode end of the varactor diode 77 in the first notch section 71 through an RF choke 84, and (ii) the anode end of the varactor diode 81 in the first notch section 72 through an RF choke 86. The common supply point of voltage $V_{T2}$ is also connected to the reference ground plane through a d-c blocking capacitor 85.

As in the operation of the embodiment of FIG. 8, the second tuning voltage $V_{T2}$ serves to change the existing reverse-bias on the varactor diodes 77 and 81, respectively, and hence the junction capacitances presented to the resonant circuits of the notch sections 71 and 72, respectively.

Figure 10:
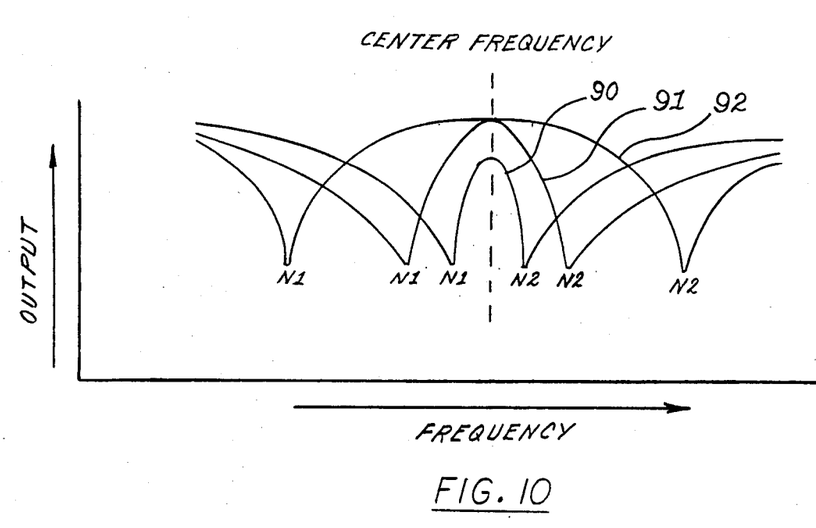
FIG. 10 is a graphical representation of several exemplary characteristic responses of the filters shown in FIGS. 8 and 9.

FIG. 10 illustrates graphically several exemplary idealized characteristic responses of the VNR filters shown in FIGS. 8 and 9 as a function of variation in the second tuning voltage $V_{T2}$. Three filter responses 90, 91 and 92 are shown for different values of the tuning voltage $V_{T2}$. The center frequency of the filter is set by a fixed value of the first tuning voltage $V_{T1}$. The second tuning voltage $V_{T2}$ is then adjusted to vary the bandwidth or the notch positions $N_1$ and $N_2$.

Because of its simple design, which allows the null points or the notches to be easily shifted by varying the second tuning voltage, the filter can be easily adjusted, via controls which can be provided on the front panel of the receiver, to produce the optimum video picture. By making these adjustments, the bandwidth of the VNR filter may be limited to some extent, but any reduction in the carrier signal modulation is more than compensated for by the rejection of TI and/or other interfering noise. Such adjustments can be made for each channel received in a particular area.

Figure 11:
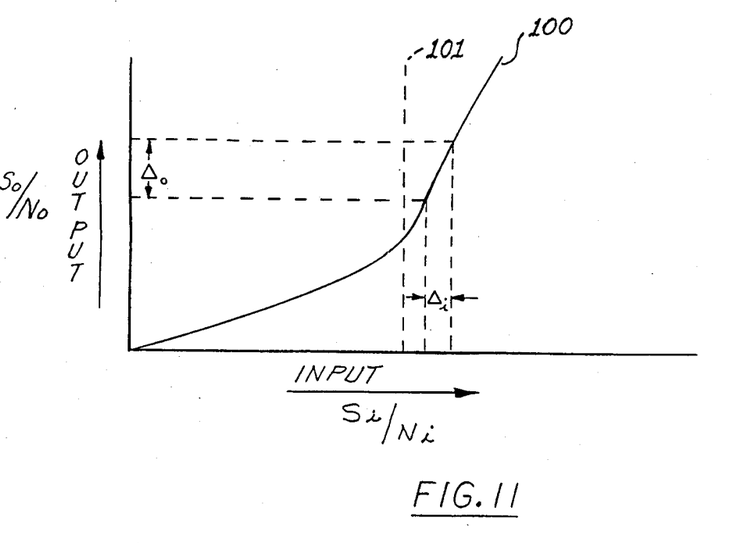
FIG. 11 is a graphical representation of typical input vs. output signal-to-noise characteristics for the TVRO receiver system of FIG. 1.

Referring next to FIG. 11, there is shown a graphical representation of typical signal-to-noise characteristic for the TVRO receiver system shown in FIG. 1, which illustrates how the VNR filter described above is so effective in improving the quality of received video images. As shown in FIG. 11, the signal-to-noise characteristic curve 100 maintains a constant slope until a threshold level 101 is reached. Below this threshold level, the output signal-to-noise ratio $S_o/N_o$ varies essentially linearly with the input signal-to-noise ratio $S_i/N_i$. Above the threshold level 101, however, the curve 100 has a significantly increased slope, and it is within this region that the TVRO receiver generally operates.

In this region of increased slope, even a small increase $\Delta i$ in the input signal-to-noise ratio produces a larger change $\Delta o$ in the output signal-to-noise ratio. Consequently, by suppressing a portion of the noise at the receiver input the filter according to the present invention brings about a dramatic improvement in the output signal-to-noise ratio, thereby producing a significantly improved video signal.

Figure 12:
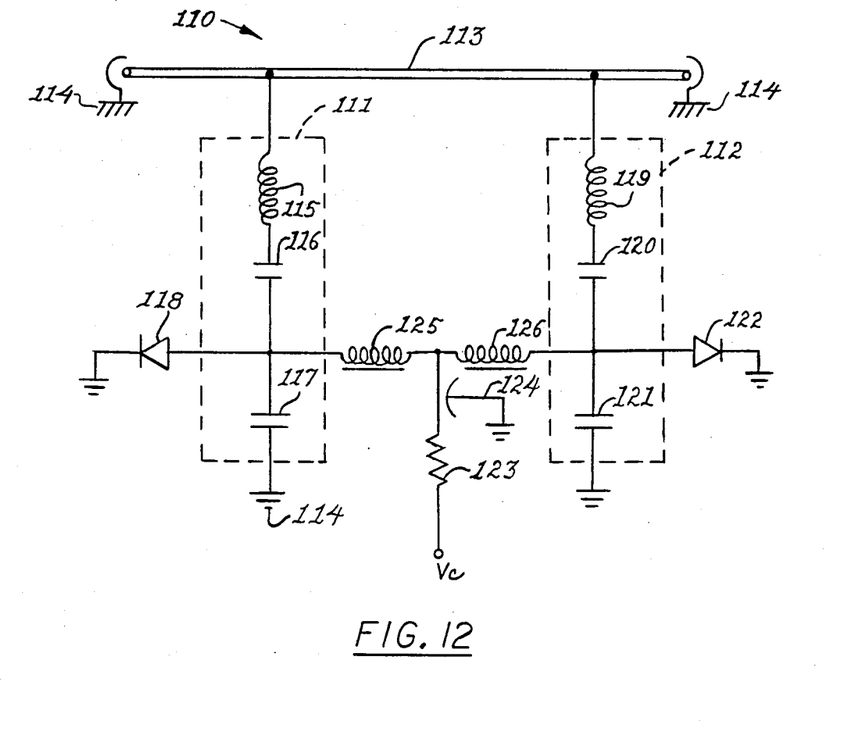
FIG. 12 is a schematic diagram of an electronically switchable VNR filter for use, according to the system of the invention, with the TVRO receiver system of FIG. 1.

Referring next to FIG. 12, there is shown a switchable version of a VNR filter according to the system of this invention. This switchable filter 110 essentially comprises a first notch section 111 and a second notch section 112 connected in parallel fashion across a length of conventional 50-ohm-type strip transmission line 113 and a reference ground plane 114. The first notch section 111 consists of a series resonant circuit comprising an inductance 115 and a serially connected pair of capacitances 116 and 117. The junction of the capacitances is connected to the reference ground plane through a conventional PIN diode 118 with the anode end of the diode toward the ground plane. The second notch section 112 consists of a series resonant circuit comprising an inductance 119 and a serially connected pair of capacitances 120 and 121. The junction of the capacitances 120, 121 is connected to the reference ground plane through a conventional PIN diode 122 with the anode end of the diode toward the ground plane. As is well known, the PIN diodes act as ordinary diodes at frequencies up to about 100 MHz. However, at the microwave frequencies used for the transmission of TV signals, which is the applicable frequency range for the filter of this invention, the PIN diodes cease to act as rectifiers and instead behave like variable resistances.

When the bias on such a PIN diode is varied, its microwave resistance changes from a typical value of 5 to 10 K ohms under negative bias, to the vicinity of 1 to 10 ohms when the bias is positive. This variable resistance property of a PIN diode can be used to make it perform like an electronically controlled switch.

Returning to FIG. 12, a control voltage $V_c$ is applied through a limiting resistance 123 and a blocking capacitor 124 to (i) the cathode end of the PIN diode 118 within the first notch section 111 through an RF choke 125, and (ii) the cathode end of the PIN diode 122 within the second notch section 112 through an RF choke 126.

When the control voltage $V_c$ is low (0 volts), the PIN diodes are effectively reverse biased and hence present a very high resistance. In this mode, the resonant circuits of the two notch sections 111 and 112 are controlled by the cumulative effect of the series capacitors 116, 117 and 120, 121, respectively.

When the control voltage $V_c$ is high (typically 5 volts), the bias on the PIN diodes 118 and 122 is shifted into the forward region and the resistance of the diodes is switched from the preceding high value to an extremely low value. This effectively shorts the capacitance 117 in the first notch section and the capacitance 121 in the second notch section out of their respective resonant circuits. The resulting change in the overall capacitances of the resonant circuits shifts their effective resonant frequencies. This produces a corresponding change in the notch frequencies of the notch sections and thus the overall response of the filter 110 is shifted.

We claim:

1. A TVRO receiver for receiving frequencymodulated video signals centered within a frequency range having a nominal center frequency, the receiver comprising:

a tuner including a superheterodyne circuit having a voltage-controlled oscillator (VCO), means for supplying a controlling input voltage to said VCO, and a mixer for combining incoming 1st IF signals within a predetermined IF frequency range with the output of said VCO to reduce the frequency of the 1st IF signals to within a 2nd IF frequency range having a predetermined nominal center frequency which permits the output frequencies of said VCO to be above the frequency range of the 1st IF signals, thereby preventing the output of the VCO from the interfering with the 1st IF signals, and a single linear phase passband filter for passing a single video channel in the 2nd IF output from said mixer, said filter having adjustable passband characteristics for producing an output which is at least about 10 dB down from its peak at both +10 MHz and −10 MHz from the center of the passband of said filter.

2. The TVRO receiver of claim 1 wherein the received signals are centered at a frequency which is offset from the nominal center frequency of the signals whereby signals produced by said mixer within the 2nd IF frequency range are centered at a frequency which is correspondingly offset from the nominal 2nd IF frequency, and the center of said filter passband is similarly offset so that the center frequency of the passband is aligned with the frequency at which the received signals are centered.

3. The TVRO receiver of claim 1 wherein said filter passband is between about 20 and about 25 MHz wide.

4. The TVRO receiver of claim 1 wherein said 1st IF signals have a frequency of 950 to 1450 MHz, and said second IF signals have a center frequency of at least 500 MHz.

5. The TVRO receiver of claim 1 wherein said filter comprises an electronically tunable filter having adjustable range, center frequency and notch frequencies and comprising first and second notch sections having notch frequencies which are adjustably separated, said sections being connected in a parallel fashion across a common section of strip transmission line and a reference ground plane, and having first and second notch frequencies, respectively, each of said notch sections comprising a tunable resonant circuit including capacitance, inductance and a voltage-controlled variable-reactance device, said range and said center frequency of said filter being adjustable by a first tuning voltage applied to said first notch section, and the separation between said first and second notch frequencies being adjustable by a second tuning voltage applied to both the said first and second notch sections.

6. The TVRO receiver of claim 5 wherein said tunable resonant circuit of said first notch section has a varactor diode connected with its anode end toward said strip line, and said tunable resonant circuit of said second notch section of said filter has a diode connected with its cathode end toward said strip line.

7. The TVRO receiver of claim 6 wherein said filter has said first tuning voltage applied to said anode end of said varactor diode in said first notch section through a radio-frequency choke, and said anode end also connected to said reference ground plane through a capacitance means.

8. The TVRO receiver of claim 7 wherein said filter has the cathode end of said varactor diode of said second notch section also connected to said reference ground plane through a parallel circuit comprising a radio-frequency choke and capacitance means.

9. The TVRO receiver of claim 8 wherein said second tuning voltage is applied to said cathode end of said varactor diode in said first notch section through a first series connection of resistance and capacitance means, and said second tuning voltage is also applied to said anode end of said varactor diode in said second notch section through a second series connection of resistance and capacitance means.

10. The TVRO receiver of claim 5 wherein said tunable resonant circuit of said first notch section has a varactor diode connected with its cathode end toward said strip line, and said tunable resonant circuit of said second notch section of said filter has a diode connected with its anode end towards said strip-line and its cathode end connected to said ground plane.

11. The TVRO receiver of claim 10 wherein said first tuning voltage is applied to said anode end of said varactor diode in said first notch section through a series connection comprising resistance and capacitance means, and said anode end of said varactor diode is also connected to said reference ground plane through capacitance means.

12. The TVRO receiver of claim 11 wherein said second tuning voltage is applied to said cathode end of said varactor diode in said second notch section through a first radio frequency choke, said second tuning voltage is also applied to said anode end of said varactor diode in said first notch section through a second radio frequency choke, and said first and second radio frequency chokes are joined to form a common point for applying said second tuning voltage, and said common point is also connected to said reference ground plane through capacitance means.

13. The TVRO receiver of claim 1 wherein said filter comprises:

an electronically switchable filter having notch frequencies which may be switched from one set of predefined values to another and comprising first and second notch sections connected in a parallel fashion across a common section of strip transmission line and a reference ground plane, and having first and second notch frequencies, respectively, each of said notch sections comprising a tunable resonant circuit including inductance and capacitance means and means for selectively switching the capacitance of said resonant circuit between one of two predefined values in response to a control voltage applied to said notch section.

14. The TVRO receiver of claim 13 wherein said means for selectively switching the capacitance of said resonant circuits includes a PIN diode operative to exclude a portion of said capacitance means from said resonant circuits in response to a prescribed value of said control voltage.

15. The TVRO receiver of claim 14 wherein said resonant circuit within each of said notch sections comprises a series connection of an inductance means, and serially connected first and second capacitance means, and each of said notch sections has a PIN diode having an anode and a cathode end with the cathode end of said PIN diode being connected to the point connection between the first and second capacitance means within said resonant circuit and the anode end of said PIN diode being connected to the reference ground plane.

16. The TVRO receiver system of claim 15 wherein said control voltage is applied through a series connection of resistance and capacitance means to a point which is connected to the cathode end of said PIN diode in said first notch section through a first radio-frequency choke and to the cathode end of said PIN diode in said second notch section through a second radio-frequency choke.

17. A TVRO receiver for receiving frequency-modulated video signals centered within a frequency range having a nominal center frequency, said received signals being centered at a frequency which is offset from the nominal center frequency of the signals, the receiver comprising:

a tuner including a superheterodyne circuit having a voltage-controlled oscillator (VCO), means for supplying a controlling input voltage to said VCO, and a mixer for combining incoming 1st IF signals within a predetermined IF frequency range with the output of said VCO to reduce the frequency of the 1st IF signals to within a 2nd IF frequency range having a predetermined nominal center frequency, the resulting 2nd IF video signals being centered at a frequency which is offset from the nominal 2nd IF center frequency, and a single passband filter for passing a single video channel, means for offsetting the center frequency of the passband of said filter to be aligned with the frequency at which said 2nd IF signals are centered.

18. The TVRO receiver of claim 17 wherein said filter is a linear phase filter having a passband profile which is at least about 10 dB down from its peak at both +10 MHz and −10 MHz from the frequency at which received signals in the passband are centered.

19. The TVRO receiver of claim 17 wherein the 2nd IF frequency range is sufficiently high to permit the output frequencies of said VCO to be above the frequency range of the 1st IF signals.

20. The TVRO receiver of claim 17 wherein said filter passband is between about 20 and about 25 MHz wide.

21. The TVRO receiver of claim 17 wherein said 1st IF signals have a frequency of 950 to 1450 MHz, and said 2nd IF signals have a center frequency of at least 500 MHz.

* * * * *